United States Patent
Li et al.

(10) Patent No.: US 9,082,664 B2
(45) Date of Patent: Jul. 14, 2015

(54) METHOD FOR MANUFACTURING THIN-FILM TRANSISTOR SUBSTRATE AND THIN-FILM TRANSISTOR SUBSTRATE MANUFACTURED WITH SAME

(71) Applicant: Shenzhen China Star Optoelectronics Technology Co., Ltd., Shenzhen, Guangdong (CN)

(72) Inventors: Wenhui Li, Guangdong (CN); Chihyuan Tseng, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 14 days.

(21) Appl. No.: 14/236,684

(22) PCT Filed: Nov. 18, 2013

(86) PCT No.: PCT/CN2013/087357
§ 371 (c)(1),
(2) Date: Feb. 3, 2014

(87) PCT Pub. No.: WO2015/070463
PCT Pub. Date: May 21, 2015

(65) Prior Publication Data
US 2015/0129863 A1    May 14, 2015

(51) Int. Cl.
*H01L 27/12* (2006.01)
*H01L 29/786* (2006.01)
*H01L 29/66* (2006.01)
*H01L 29/45* (2006.01)
*H01L 21/02* (2006.01)
*H01L 21/441* (2006.01)

(52) U.S. Cl.
CPC ...... *H01L 27/1225* (2013.01); *H01L 21/02422* (2013.01); *H01L 21/02565* (2013.01); *H01L 21/441* (2013.01); *H01L 27/1259* (2013.01); *H01L 29/45* (2013.01); *H01L 29/66969* (2013.01); *H01L 29/7869* (2013.01); *H01L 29/78603* (2013.01)

(58) Field of Classification Search
CPC ...... H01L 29/7869; H01L 21/16; H01L 21/00
See application file for complete search history.

(56) References Cited

U.S. PATENT DOCUMENTS

| | | | | |
|---|---|---|---|---|
| 2010/0051933 | A1* | 3/2010 | Kim et al. | 257/43 |
| 2012/0199891 | A1* | 8/2012 | Suzuki et al. | 257/288 |
| 2013/0313546 | A1* | 11/2013 | Yu | 257/43 |

FOREIGN PATENT DOCUMENTS

JP        H0728077 A        1/1995

*Primary Examiner* — Mohammad Islam
*Assistant Examiner* — Charles R Peters
(74) *Attorney, Agent, or Firm* — Andrew C. Cheng

(57) ABSTRACT

The present invention provides a method for manufacturing a thin-film transistor substrate and a thin-film transistor substrate manufactured with the method. The method includes: (1) providing a substrate (20); (2) forming a gate terminal (22) having a predetermined structure on the substrate (20); (3) forming a gate insulation layer (24) on the gate terminal (22) and the substrate (20); (4) forming a metal signal line (26) having a predetermined structure on the gate insulation layer (24); (5) forming an oxide semiconductor layer (28) having a predetermined structure on the gate insulation layer (24); (6) forming a passivation layer (32) having a predetermined structure on the gate insulation layer (24), the metal signal line (26), and the oxide semiconductor layer (28); and (7) forming a source/drain terminal (34) having a predetermined structure on the metal signal line (26), the oxide semiconductor layer (28), and the passivation layer (32) so as to form a thin-film transistor substrate.

14 Claims, 9 Drawing Sheets

METHOD FOR MANUFACTURING THIN-FILM TRANSISTOR SUBSTRATE AND THIN-FILM TRANSISTOR SUBSTRATE MANUFACTURED WITH SAME

BACKGROUND OF THE INVENTION

1. Field of the Invention

The present invention relates to the field of liquid crystal displaying, and in particular to a method for manufacturing a thin-film transistor (TFT) substrate and a thin-film transistor substrate manufactured with the method.

2. The Related Arts

A thin-film transistor (TFT) has been widely used in electronic devices to serve as a switching device and a driving device. Specifically, the thin-film transistors can be formed on a glass substrate or a plastic substrate so that they are commonly used in the field of flat panel display devices, such as a liquid crystal display (LCD), an organic light-emitting display (OLED), and an electro-phoretic display (EPD).

Oxide semiconductors have a relatively high electron mobility (the electron mobility of oxide semiconductors >10 $cm^2/Vs$, while the mobility of a-Si being only 0.5-0.8 $cm^2/Vs$) and, compared to low temperature poly-silicon (LTPS), the oxide semiconductors have a simple manufacturing process, are highly compatible with a-Si manufacturing processes, are applicable to the fields of LCDs, OLEDs, and flexible displays, and are compatible to high generation manufacturing lines for applications to displays of large, medium, and small sizes, so as have a prosperous future of applications and be a hot spot of researches of the industry. Among the studies of the oxide semiconductors, InGaZnO (IGZO) semiconductors are the most developed one.

A thin-film transistor substrate comprises thin-film transistors and pixel electrodes. For a conventional oxide semiconductor thin-film transistor substrate, as shown in FIG. 1, after an oxide semiconductor layer 100 has been formed, a metal source/drain electrode 200 must be formed. The metal source/drain electrode 200 uses a wet etching process, which often uses strong acids and mixtures thereof (such as $HNO_3$/$H_3PO_4$/$CH_3COOH$) that readily cause damages of the oxide semiconductor of a back channel etching site. Using a dry etching process instead, however, causes problems of poor uniformity of etching. To dissolve such a problem, the known techniques often form an etch-stop layer (ESL) 300 after the formation of the oxide semiconductor layer 100 and before the formation of the metal source/drain electrode 200 in order to protect the oxide semiconductor layer of the back channel etching site for preventing damage caused in the processes of for example etching of metal source/drain electrode 200. However, forming the additional etch-stop layer requires an additional photolithographic process. The photolithographic process comprises various operations, such as film forming, exposure, development, etching, and peeling, so that forming such an additional etch-stop layer would greatly increase the manufacture cost and lower down yield rate.

SUMMARY OF THE INVENTION

An object of the present invention is to provide a method for manufacturing a thin-film transistor substrate, which can effective avoid damages of an oxide semiconductor layer caused by etching processes of metal signal lines and source/drain electrodes, enhance stability and uniformity of thin-film transistor substrates, improve yield rate, expand the likelihood of mass production of oxide semiconductor thin-film transistor substrate, and can reduce one round of photolithographic process to thereby greatly lower down the manufacture cost and improve manufacture yield rate.

Another object of the present invention is to provide a thin-film transistor substrate, which has a simple structure, possesses enhanced stability and uniformity, has a simple manufacturing process, and can reduce one round of photolithographic process to thereby greatly lower down the manufacture cost and improve manufacture yield rate.

To achieve the above objects, the present invention provides a method for manufacturing a thin-film transistor substrate, which comprises the following steps:

(1) providing a substrate;

(2) forming a gate terminal having a predetermined structure on the substrate;

(3) forming a gate insulation layer on the gate terminal and the substrate;

(4) forming a metal signal line having a predetermined structure on the gate insulation layer;

(5) forming an oxide semiconductor layer having a predetermined structure on the gate insulation layer;

(6) forming a passivation layer having a predetermined structure on the gate insulation layer, the metal signal line, and the oxide semiconductor layer; and (7) forming a source/drain terminal having a predetermined structure on the metal signal line, the oxide semiconductor layer, and the passivation layer so as to form a thin-film transistor substrate.

The substrate is a glass substrate; the oxide semiconductor layer is formed of indium gallium zinc oxide, indium gallium oxide, zinc oxide, aluminum oxide, or tin oxide.

In step (6), at the same time when the passivation layer is formed, an etch-stop layer having a predetermined structure is also formed, the etch-stop layer being located on the oxide semiconductor layer the passivation layer being arranged at opposite sides of the etch-stop layer, the passivation layer and the etch-stop layer being made of the same material or different materials.

In step (7), at the same time when the source/drain terminal is formed, a pixel electrode is also formed, the pixel electrode being formed on the passivation layer and electrically connected with the source/drain terminal, the source/drain terminal and the pixel electrode being both formed of transparent conductive oxide.

The transparent conductive oxide comprises indium tin oxide.

The present invention also provides a method for manufacturing a thin-film transistor substrate, which comprises the following steps:

(1) providing a substrate;

(2) forming a gate terminal having a predetermined structure on the substrate;

(3) forming a gate insulation layer on the gate terminal and the substrate;

(4) forming a metal signal line having a predetermined structure on the gate insulation layer;

(5) forming an oxide semiconductor layer having a predetermined structure on the gate insulation layer;

(6) forming a passivation layer having a predetermined structure on the gate insulation layer, the metal signal line, and the oxide semiconductor layer; and (7) forming a source/drain terminal having a predetermined structure on the metal signal line, the oxide semiconductor layer, and the passivation layer so as to form a thin-film transistor substrate;

wherein in step (6), at the same time when the passivation layer is formed, an etch-stop layer having a predetermined structure is also formed, the etch-stop layer being located on the oxide semiconductor layer the passivation layer being arranged at opposite sides of the etch-stop layer, the passivation layer and the etch-stop layer being made of the same material or different materials.

The substrate is a glass substrate; the oxide semiconductor layer is formed of indium gallium zinc oxide, indium gallium oxide, zinc oxide, aluminum oxide, or tin oxide.

In step (7), at the same time when the source/drain terminal is formed, a pixel electrode is also formed, the pixel electrode being formed on the passivation layer and electrically connected with the source/drain terminal, the source/drain terminal and the pixel electrode being both formed of transparent conductive oxide.

The transparent conductive oxide comprises indium tin oxide.

The present invention further provides a thin-film transistor substrate, which comprises:

a substrate;

a gate terminal, which is located on the substrate;

a gate insulation layer, which is located on the substrate and the gate terminal;

a metal signal line, which is located on the gate insulation layer;

an oxide semiconductor layer, which is located on the gate insulation layer and arranged at one side of the metal signal line;

a passivation layer, which is located on the gate insulation layer, the metal signal line, and the oxide semiconductor layer;

a source/drain terminal, which is located on the metal signal line, the oxide semiconductor layer, and the passivation layer, the source/drain terminal being electrically connected with the metal signal line; and a pixel electrode, which is located on the passivation layer and is in direct contact with the source/drain terminal, and is located on the same layer as the source/drain terminal, the source/drain terminal and the pixel electrode being formed of transparent conductive oxide.

The substrate is a glass substrate.

The oxide semiconductor layer is formed of indium gallium zinc oxide, indium gallium oxide, zinc oxide, aluminum oxide, or tin oxide.

Thin-film transistor substrate further comprises an etch-stop layer located on the oxide semiconductor layer. The etch-stop layer and the passivation layer are formed at the same time and are made of the same material or different materials.

The source/drain terminal and the pixel electrode are formed at the same time and the transparent conductive oxide is indium tin oxide.

The efficacy of the present invention is that the present invention provides a method for manufacturing a thin-film transistor substrate and a thin-film transistor substrate manufactured with the method, wherein an oxide semiconductor layer is formed after a metal signal line and further, an etch-stop layer is manufactured before formation of a source/drain terminal, and a transparent conductive oxide (TCO) is used to replace the conventional material for manufacturing the source/drain terminal in order to avoid damages of the oxide semiconductor layer caused by etching processes of the metal signal line and the source/drain terminal, thereby enhancing stability and uniformity of the thin-film transistor substrate, improving manufacture yield rate, and expanding the likelihood of mass production of the oxide semiconductor thin-film transistor substrate. Further, the etch-stop layer and the passivation layer are formed on the same layer and the source/drain electrode and the pixel electrode are formed on the same layer so that the number of layers made is reduced by one and one round of photolithographic process (which comprises operations of film forming, exposure, development, etching, and peeling) is reduced so as to greatly lower down the manufacture cost and improve manufacture yield rate.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
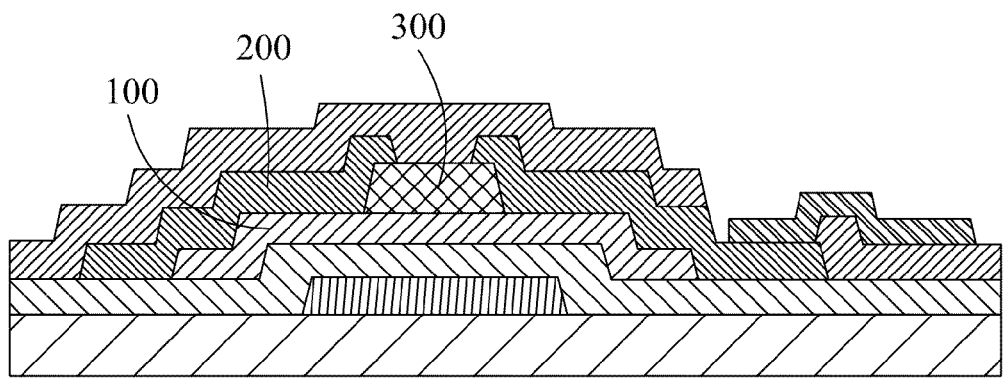
FIG. 1 is a schematic view showing the structure of a conventional thin-film transistor substrate.
Figure 2:
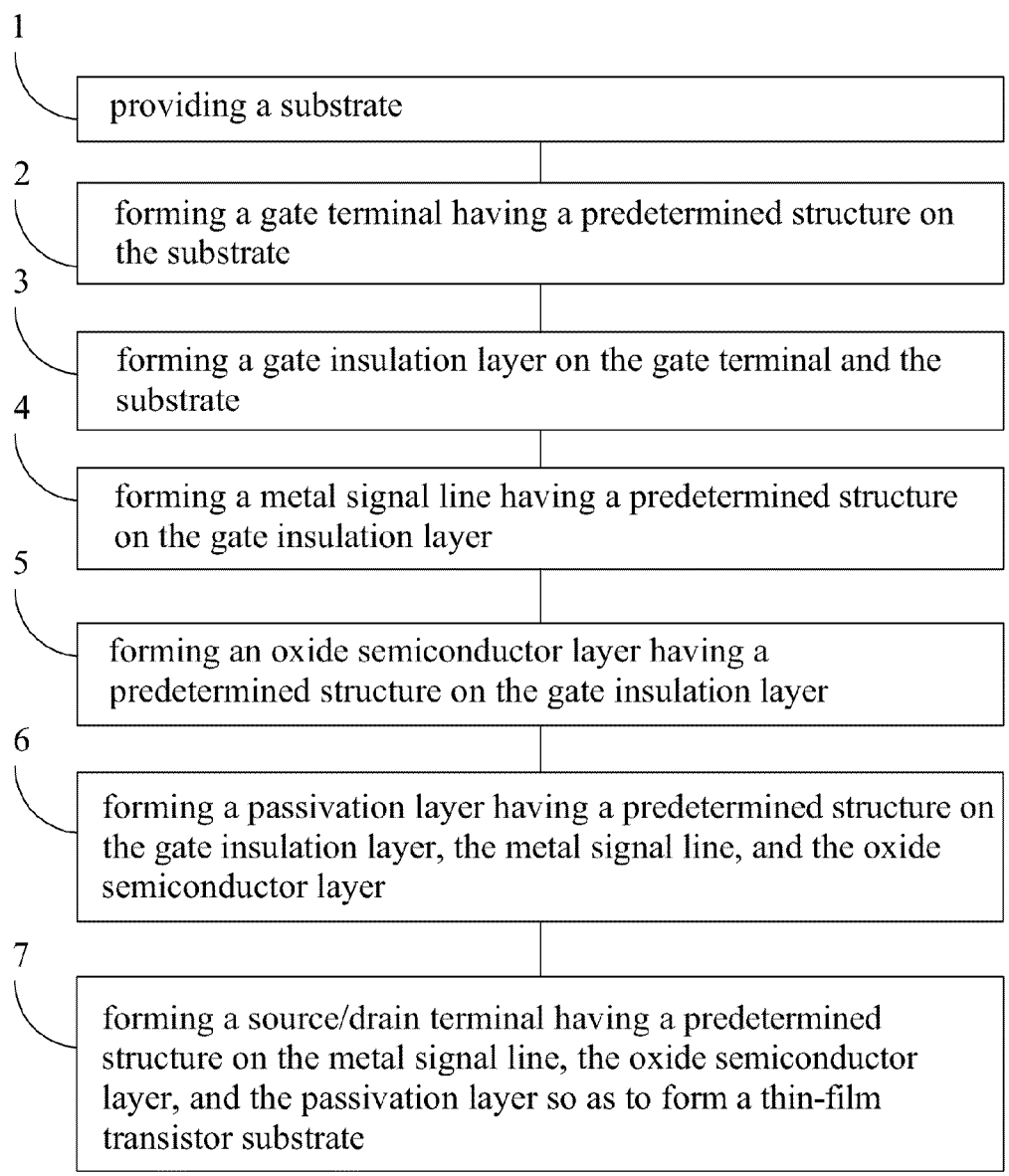
FIG. 2 is a flow chart illustrating a method for manufacturing a thin-film transistor substrate according to the present invention.
Figure 3:
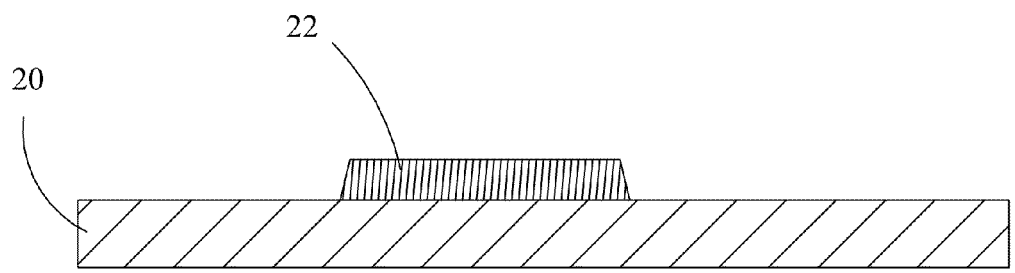
FIGS. 3-8 are schematic views illustrating a process of manufacturing a thin-film transistor substrate by using the method for manufacturing a thin-film transistor substrate according to an embodiment of the present invention.
Figure 4:
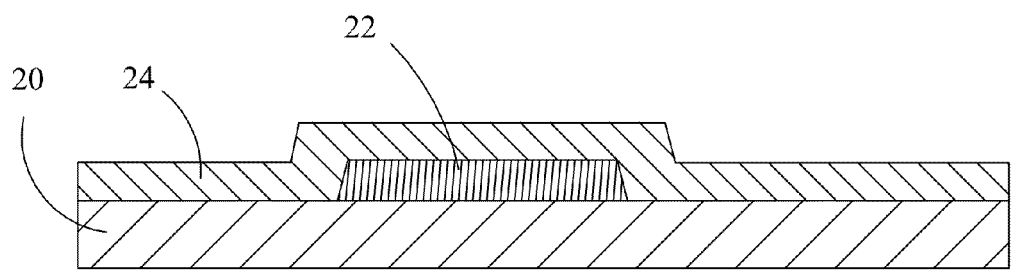
Figure 5:
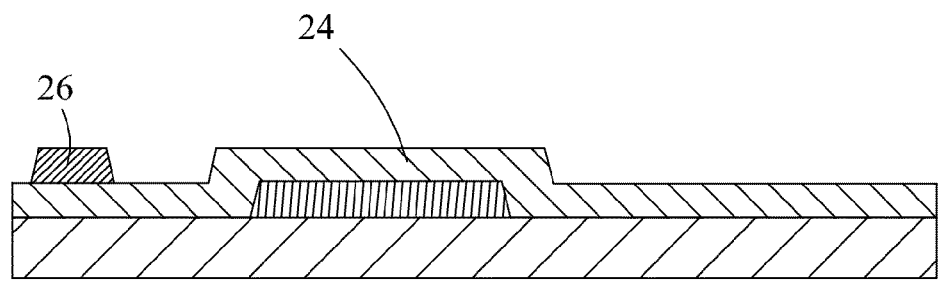
Figure 6:
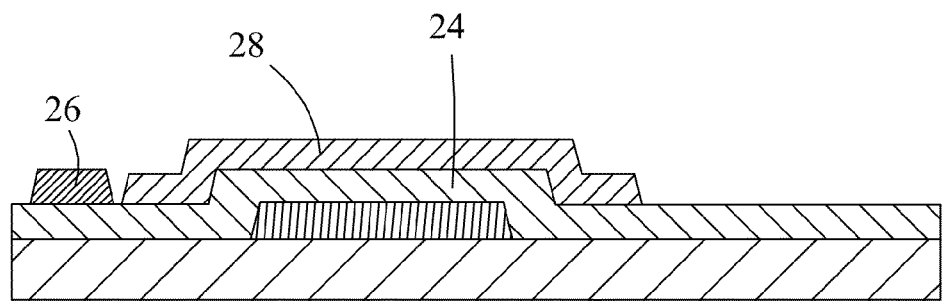
Figure 7:
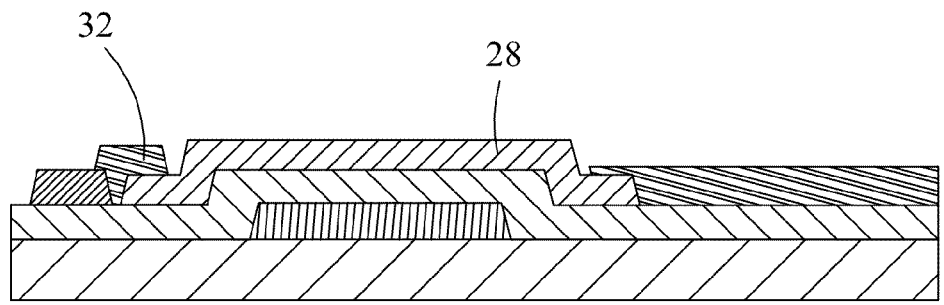
Figure 8:
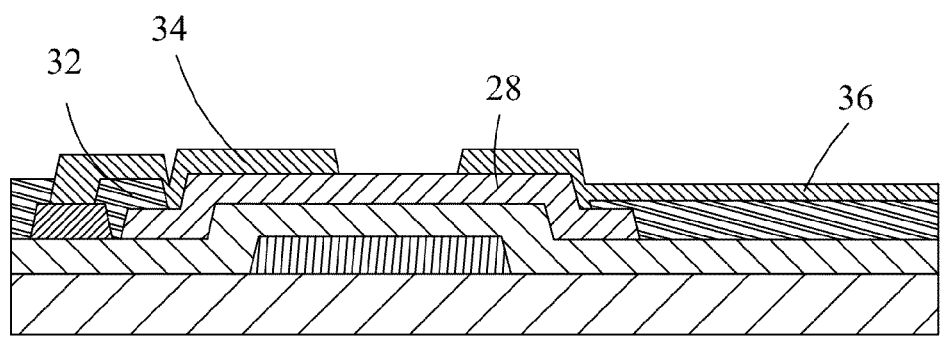
Figure 9:
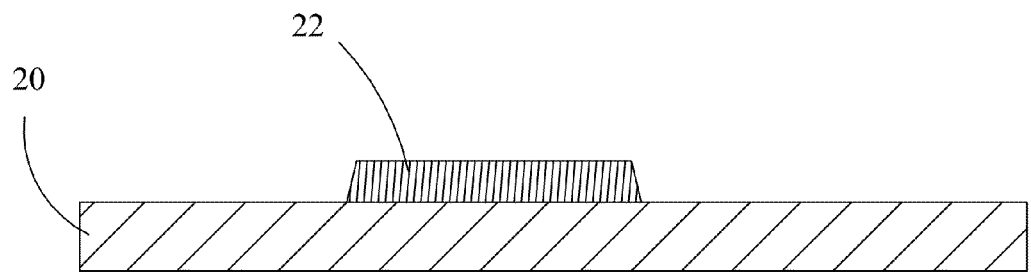
FIGS. 9-14 are schematic views illustrating a process of manufacturing a thin-film transistor substrate by using the method for manufacturing a thin-film transistor substrate according to another embodiment the present invention.
Figure 10:
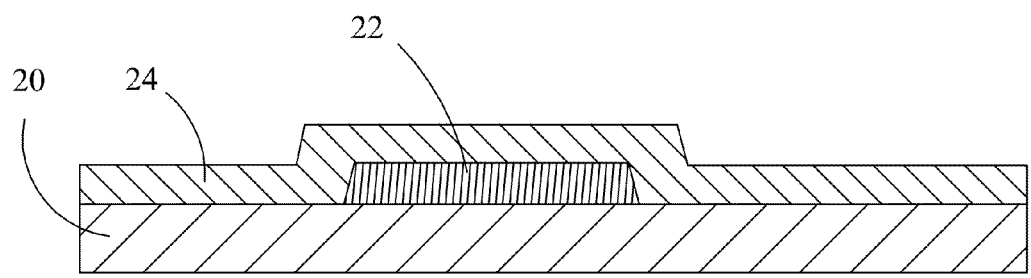
Figure 11:
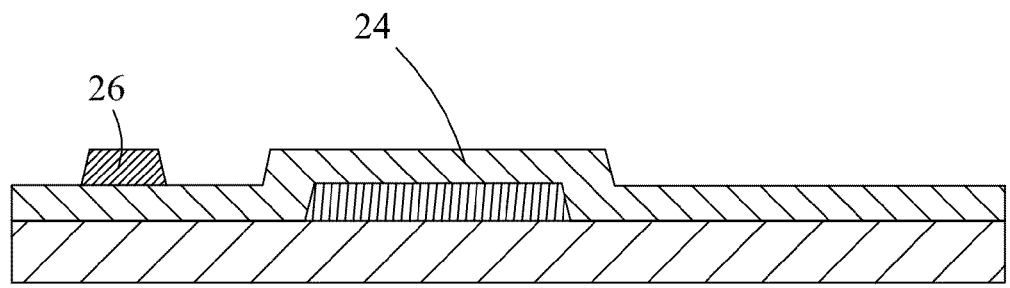
Figure 12:
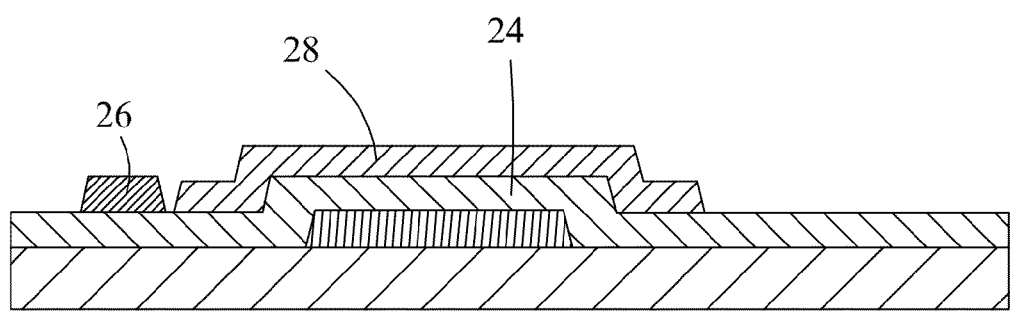
Figure 13:
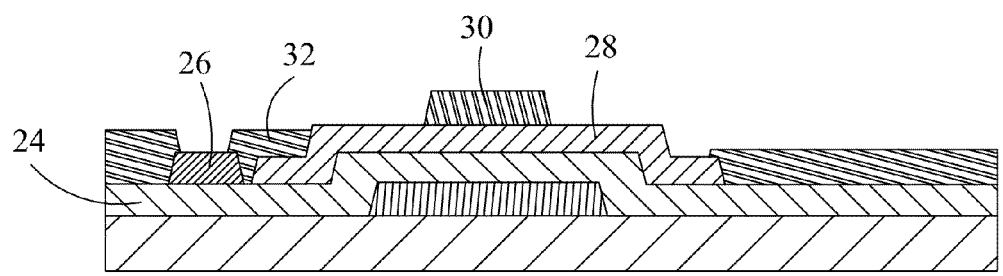
Figure 14:
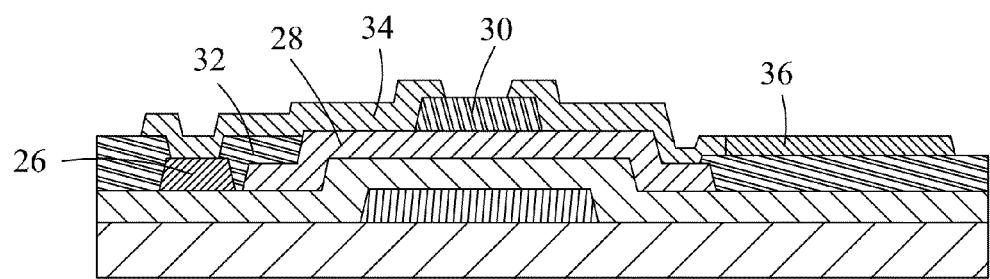

Referring to FIG. 2, with additional reference had to FIGS. 3-8, the present invention provides a method for manufacturing a thin-film transistor substrate, which comprises the following steps:

Step 1: providing a substrate 20.

The substrate 20 is a transparent substrate, preferably a glass substrate or a plastic substrate. In the instant embodiment, the substrate 20 is a glass substrate.

Step 2: forming a gate terminal 22 having a predetermined structure on the substrate 20.

A first-round photolithographic process is applied to form the gate terminal 22 having the predetermined structure on the substrate 20 and the specific processing flow includes: first depositing a first metal layer on the substrate 20 and then applying a mask or a halftone mask to subject the first metal layer to exposure, development, and etching so as to form the predetermined structure of the gate terminal 22, thereby completing the first-round photolithographic process. The first metal layer is generally one of an aluminum layer, a copper layer, and a molybdenum layer or a combination thereof.

Step 3: forming a gate insulation layer 24 on the gate terminal 22 and the substrate 20.

A second-round photolithographic process is applied to form the gate insulation layer 24 on the gate terminal 22 and the substrate 20. The gate insulation layer 24 generally comprises one of silicon oxide and silicon nitride or a combination thereof and is formed in a way similar to that of the above described gate terminal 22 so that repeated description will be omitted.

Step 4: forming a metal signal line 26 having a predetermined structure on the gate insulation layer 24.

A third-round photolithographic process is applied to form the metal signal line 26 having the predetermined structure on the gate insulation layer 24 and the specific processing flow includes: depositing a second metal layer on the gate insulation layer 24 and then applying a mask or a halftone mask to subject the second metal layer to exposure, development, and etching so as to form the predetermined structure of the metal signal line 26.

The second metal layer is generally one of an aluminum layer, a copper layer, and a molybdenum layer or a combination thereof.

Step 5: forming an oxide semiconductor layer 28 having a predetermined structure on the gate insulation layer 24.

A fourth-round photolithographic process is applied to form the oxide semiconductor layer 28 having the predetermined structure on the gate insulation layer 24 and the way of formation is similar to that of the above described gate terminal 22 or metal signal line 26 so that repeated description will be omitted.

The oxide semiconductor layer 28 can be one of an indium gallium zinc oxide (IGZO) semiconductor layer, an indium gallium oxide semiconductor layer, a zinc oxide semiconductor layer, an aluminum oxide semiconductor layer, and a tin oxide semiconductor layer and is preferably an indium gallium zinc oxide semiconductor layer. The oxide semiconductor layer 28 is located at one side of the metal signal line 26 and preferably, the oxide semiconductor layer 28 and the metal signal line 26 are shifted from each other in a horizontal direction.

The oxide semiconductor layer 28 is manufactured after the formation of the metal signal line 26 so as to avoid damages of the oxide semiconductor layer caused by the etching operation of the metal signal line 26 so as to enhance the stability and uniformity of the thin-film transistor substrate, improve manufacture yield rate, and expand the likelihood of mass production of the oxide semiconductor thin-film transistor substrate.

Step 6: forming a passivation layer 32 having a predetermined structure on the gate insulation layer 24, the metal signal line 26, and the oxide semiconductor layer 28.

A fifth-round photolithographic process is applied to form the passivation layer 32 having the predetermined structure on the gate insulation layer 24, the metal signal line 26, the oxide semiconductor layer 28. The way of forming passivation layer 32 is similar to that of the above described gate terminal 22 or metal signal line 26 so that repeated description will be omitted.

It is noted that after the passivation layer 32 is formed on the metal signal line 26, a portion of the passivation layer 32 that corresponds to the metal signal line 26 must be etched off in order to form a contact hole for exposing the metal signal line 26, allowing for electrical connection of a source/drain terminal 34 that is formed after the formation of the passivation layer 32 with the metal signal line 26. The etching operation used can be a dry etching process or a wet etching process.

Step 7: forming a source/drain terminal 34 having a predetermined structure on the metal signal line 26, the oxide semiconductor layer 28, and the passivation layer 32 so as to form a thin-film transistor substrate.

In Step 7, at the same time when the source/drain terminal 34 is formed, a pixel electrode 36 is also formed. The pixel electrode 36 is formed on the passivation layer 32 and is electrically connected to the source/drain terminal 34. The source/drain terminal 34 and the pixel electrode 36 are both formed of a transparent conductive oxide (TCO). In the instant embodiment, the transparent conductive oxide is preferably indium tin oxide.

The source/drain terminal 34 and the pixel electrode 36 are formed in a way similar to the above described gate terminal 22 or metal signal line 26 so that repeated description will be omitted.

It is noted that the thin-film transistor substrate according to the present invention can be applied to various fields including a liquid crystal display (LCD), an organic light-emitting display (OLED), and an electro-phoretic display (EPD) and can be used in the field of active displaying applications, including both non-flexible and flexible displays, and can be used in displays of large, medium, and small sizes.

Figure 16:
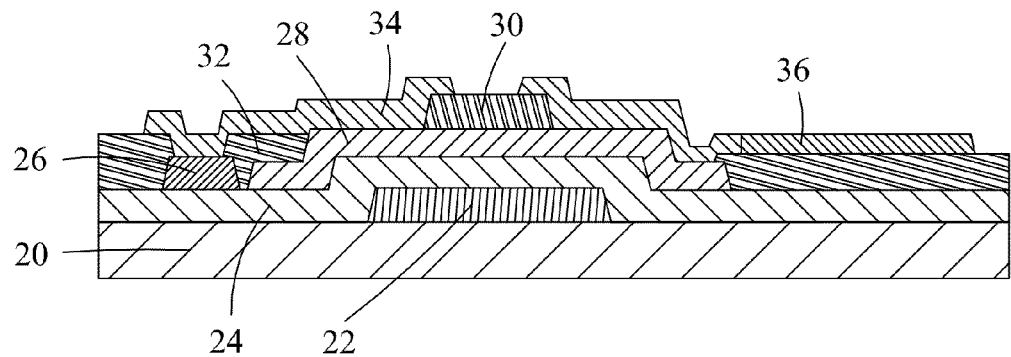
FIG. 16 is a schematic view showing the structure of a thin-film transistor substrate according another embodiment of the present invention.

Referring to FIGS. 9-14, with additional reference to FIG. 16, schematic views illustrating a process of manufacturing a thin-film transistor substrate by using the method for manufacturing a thin-film transistor substrate according to another embodiment the present invention are given. In the instant embodiment, Steps 1-5 and Step 7 are identical to counterpart steps of the previous embodiment and a difference resides in Step 6. In Step 6 of the instant embodiment, at the same time when the passivation layer 32 is formed, an etch-stop layer 30 having a predetermined structure is also formed. The etch-stop layer 30 is located on the oxide semiconductor layer 28, while the passivation layer 32 is located on opposite sides of the etch-stop layer 30. The passivation layer 32 and the etch-stop layer 30 can be made of the same material or they can be made of different materials. In the instant embodiment, the passivation layer 32 and the etch-stop layer 30 are made of the same material.

The etch-stop layer 30 is provided to protect the oxide semiconductor layer 28 at a back channel etching site to avoid of damages caused thereon by a process of etching of the source/drain terminal 34.

In the instant embodiment, the etch-stop layer 30 and the passivation layer 32 are formed as the same layer so that the number of layers manufactured can be reduced by one. In other words, one round of photolithographic process (which comprises operations of film forming, exposure, development, etching, and peeling) can be reduced so as to greatly lower down the manufacture cost and improve manufacture yield rate.

Figure 15:
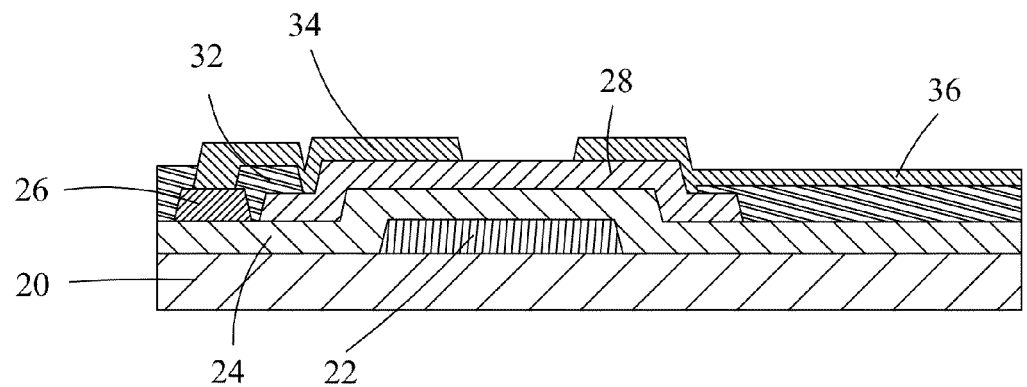
FIG. 15 is a schematic view showing the structure of a thin-film transistor substrate according an embodiment of the present invention.

Referring to FIG. 15, the present invention also provides a thin-film transistor substrate, which comprises: a substrate 20, a gate terminal 22, a gate insulation layer 24, a metal signal line 26, an oxide semiconductor layer 28, a passivation layer 32, a source/drain terminal 34, and a pixel electrode 36.

The substrate 20 is a transparent substrate, preferably a glass substrate or a plastic substrate. In the instant embodiment, the substrate 20 is a glass substrate.

The gate terminal 22 is located on the substrate 20. The specific process for forming the gate terminal 22 on the substrate 20 includes: first depositing a first metal layer on the substrate 20 and then applying a mask or a halftone mask to subject the first metal layer to exposure, development, and etching so as to form the predetermined structure of the gate terminal 22. The first metal layer is generally one of an aluminum layer, a copper layer, and a molybdenum layer or a combination thereof.

The gate insulation layer 24 is located on the substrate 20 and the gate terminal 22. The gate insulation layer 24 generally comprises one of silicon oxide and silicon nitride or a combination thereof.

The metal signal line 26 is located on the gate insulation layer 24. The manufacturing process of the metal signal line 26 includes: depositing a second metal layer on the gate insulation layer 24 and then applying a mask or a halftone mask to subject the second metal layer to exposure, development, and etching so as to form the predetermined structure of the metal signal line 26. The second metal layer is generally one of an aluminum layer, a copper layer, and a molybdenum layer or a combination thereof.

The metal signal line 26 is manufactured before the formation of the oxide semiconductor layer 28 so as to avoid damages of the oxide semiconductor layer caused by the etching operation of the metal signal line 26 so as to enhance the stability and uniformity of the thin-film transistor substrate, improve manufacture yield rate, and expand the likelihood of mass production of the oxide semiconductor thin-film transistor substrate.

The oxide semiconductor layer 28 is located on the gate insulation layer 24 and is arranged at one side of the metal signal line 26. The oxide semiconductor layer 28 is an indium gallium zinc oxide semiconductor layer (IGZO) and preferably, the oxide semiconductor layer 28 and the metal signal line 26 are shifted from each other in a horizontal direction.

The passivation layer 32 is located on the gate insulation layer 24, the metal signal line 26, and the oxide semiconductor layer 28.

The source/drain terminal 34 is located on the metal signal line 26, the oxide semiconductor layer 28, and the passivation layer 32 and the source/drain terminal 34 is electrically connected to the metal signal line 26.

The pixel electrode 36 is located on the passivation layer 32 and is in direct contact with the source/drain terminal 34 and is located on the same layer as the source/drain terminal 34. The source/drain terminal 34 and the pixel electrode 36 are formed at the same time.

The source/drain terminal 34 and the pixel electrode 36 are both formed of a transparent conductive oxide (TCO). In the instant embodiment, the transparent conductive oxide (TCO) is indium tin oxide.

Referring to FIG. 16, which is a schematic view showing the structure of a thin-film transistor substrate according another embodiment of the present invention, in the instant embodiment, the thin-film transistor substrate further comprises an etch-stop layer 30. The etch-stop layer 30 is located on the oxide semiconductor layer 28. The etch-stop layer 30 is provided to protect the oxide semiconductor layer 28 at a back channel etching site to avoid of damages caused thereon by a process of etching of the source/drain terminal 34.

The passivation layer 32 is located on opposite sides of the etch-stop layer 30. The passivation layer 32 and the etch-stop layer 30 are located on the same layer and are formed at the same time. The passivation layer 32 and the etch-stop layer 30 can be made of the same material or they can be made of different materials. In the instant embodiment, the passivation layer 32 and the etch-stop layer 30 are made of the same material.

In the instant embodiment, the etch-stop layer 30 and the passivation layer 32 are formed as the same layer so that the number of layers manufactured can be reduced by one. In other words, one round of photolithographic process (which comprises operations of film forming, exposure, development, etching, and peeling) can be reduced so as to greatly lower down the manufacture cost and improve manufacture yield rate.

In summary, the present invention provides a method for manufacturing a thin-film transistor substrate and a thin-film transistor substrate manufactured with the method, wherein an oxide semiconductor layer is formed after a metal signal line and further, an etch-stop layer is manufactured before formation of a source/drain terminal, and a transparent conductive oxide (TCO) is used to replace the conventional material for manufacturing the source/drain terminal in order to avoid damages of the oxide semiconductor layer caused by etching processes of the metal signal line and the source/drain terminal, thereby enhancing stability and uniformity of the thin-film transistor substrate, improving manufacture yield rate, and expanding the likelihood of mass production of the oxide semiconductor thin-film transistor substrate. Further, the etch-stop layer and the passivation layer are formed on the same layer and the source/drain electrode and the pixel electrode are formed on the same layer so that the number of layers made is reduced by one and one round of photolithographic process (which comprises operations of film forming, exposure, development, etching, and peeling) is reduced so as to greatly lower down the manufacture cost and improve manufacture yield rate.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a thin-film transistor substrate, comprising the following steps:
   (1) providing a substrate;
   (2) forming a gate terminal having a predetermined structure on the substrate;
   (3) forming a gate insulation layer on the gate terminal and the substrate;
   (4) forming a metal signal line having a predetermined structure on the gate insulation layer;
   (5) forming an oxide semiconductor layer having a predetermined structure on the gate insulation layer;
   (6) forming a passivation layer having a predetermined structure on the gate insulation layer, the metal signal line, and the oxide semiconductor layer; and
   (7) forming a source/drain terminal having a predetermined structure on the metal signal line, the oxide semiconductor layer, and the passivation layer so as to form a thin-film transistor substrate.

2. The method for manufacturing the thin-film transistor substrate as claimed in claim 1, wherein the substrate is a glass substrate; the oxide semiconductor layer is formed of indium gallium zinc oxide, indium gallium oxide, zinc oxide, aluminum oxide, or tin oxide.

3. The method for manufacturing the thin-film transistor substrate as claimed in claim 1, wherein in step (6), at the same time when the passivation layer is formed, an etch-stop layer having a predetermined structure is also formed, the etch-stop layer being located on the oxide semiconductor layer the passivation layer being arranged at opposite sides of the etch-stop layer, the passivation layer and the etch-stop layer being made of the same material or different materials.

4. The method for manufacturing the thin-film transistor substrate as claimed in claim 1, wherein in step (7), at the same time when the source/drain terminal is formed, a pixel electrode is also formed, the pixel electrode being formed on the passivation layer and electrically connected with the source/drain terminal, the source/drain terminal and the pixel electrode being both formed of transparent conductive oxide.

5. The method for manufacturing the thin-film transistor substrate as claimed in claim 4, wherein the transparent conductive oxide comprises indium tin oxide.

6. A method for manufacturing a thin-film transistor substrate, comprising the following steps:
  (1) providing a substrate;
  (2) forming a gate terminal having a predetermined structure on the substrate;
  (3) forming a gate insulation layer on the gate terminal and the substrate;
  (4) forming a metal signal line having a predetermined structure on the gate insulation layer;
  (5) forming an oxide semiconductor layer having a predetermined structure on the gate insulation layer;
  (6) forming a passivation layer having a predetermined structure on the gate insulation layer, the metal signal line, and the oxide semiconductor layer; and
  (7) forming a source/drain terminal having a predetermined structure on the metal signal line, the oxide semiconductor layer, and the passivation layer so as to form a thin-film transistor substrate;
  wherein in step (6), at the same time when the passivation layer is formed, an etch-stop layer having a predetermined structure is also formed, the etch-stop layer being located on the oxide semiconductor layer the passivation layer being arranged at opposite sides of the etch-stop layer, the passivation layer and the etch-stop layer being made of the same material or different materials.

7. The method for manufacturing the thin-film transistor substrate as claimed in claim 6, wherein the substrate is a glass substrate; the oxide semiconductor layer is formed of indium gallium zinc oxide, indium gallium oxide, zinc oxide, aluminum oxide, or tin oxide.

8. The method for manufacturing the thin-film transistor substrate as claimed in claim 6, wherein in step (7), at the same time when the source/drain terminal is formed, a pixel electrode is also formed, the pixel electrode being formed on the passivation layer and electrically connected with the source/drain terminal, the source/drain terminal and the pixel electrode being both formed of transparent conductive oxide.

9. The method for manufacturing the thin-film transistor substrate as claimed in claim 8, wherein the transparent conductive oxide comprises indium tin oxide.

10. A thin-film transistor substrate, comprising:
  a substrate;
  a gate terminal, which is located on the substrate;
  a gate insulation layer, which is located on the substrate and the gate terminal;
  a metal signal line, which is located on the gate insulation layer;
  an oxide semiconductor layer, which is located on the gate insulation layer and arranged at one side of the metal signal line;
  a passivation layer, which is located on the gate insulation layer, the metal signal line, and the oxide semiconductor layer;
  a source/drain terminal, which is located on the metal signal line, the oxide semiconductor layer, and the passivation layer, the source/drain terminal being electrically connected with the metal signal line; and
  a pixel electrode, which is located on the passivation layer and is in direct contact with the source/drain terminal, and is located on the same layer as the source/drain terminal, the source/drain terminal and the pixel electrode being formed of transparent conductive oxide.

11. Thin-film transistor substrate as claimed in claim 10, wherein the substrate is a glass substrate.

12. Thin-film transistor substrate as claimed in claim 10, wherein the oxide semiconductor layer is formed of indium gallium zinc oxide, indium gallium oxide, zinc oxide, aluminum oxide, or tin oxide.

13. Thin-film transistor substrate as claimed in claim 10 further comprising an etch-stop layer located on the oxide semiconductor layer, the etch-stop layer and the passivation layer being formed at the same time and being made of the same material or different materials.

14. Thin-film transistor substrate as claimed in claim 10, wherein the source/drain terminal and the pixel electrode are formed at the same time, the transparent conductive oxide being indium tin oxide.

* * * * *